United States Patent
Yamada (10) Patent No.: US 8,882,429 B2
(45) Date of Patent: Nov. 11, 2014

(54) TRANSFER DEVICE, PROCESSING SYSTEM, CONTROL METHOD OF TRANSFER DEVICE, AND COMPUTER-READABLE STORAGE MEDIUM

(75) Inventor: Youhei Yamada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 353 days.

(21) Appl. No.: 13/232,183

(22) Filed: Sep. 14, 2011

(65) Prior Publication Data

US 2012/0072010 A1 Mar. 22, 2012

(30) Foreign Application Priority Data

Sep. 16, 2010 (JP) ................. 2010-208228

(51) Int. Cl.
*H01L 21/677* (2006.01)
*H01L 21/67* (2006.01)
*B25J 13/08* (2006.01)
*B25J 19/06* (2006.01)

(52) U.S. Cl.
CPC .... *H01L 21/67259* (2013.01); *H01L 21/67742* (2013.01); *B25J 13/081* (2013.01); *B25J 19/063* (2013.01); *H01L 21/67754* (2013.01)
USPC ....................................... 414/217

(58) Field of Classification Search
CPC ............. H01L 21/67742; H01L 21/67167; H01L 21/68707; H01L 21/67736; H01L 21/67748; H01L 21/67778; H01L 21/67703; H01L 21/67739; B25J 9/023; B25J 9/04; B25J 11/0095; B25J 18/04
USPC ............ 414/217, 222.13, 226.05, 749.1, 935, 414/939; 700/213
See application file for complete search history.

(56) References Cited

U.S. PATENT DOCUMENTS

| | | | | |
|---|---|---|---|---|
| 6,532,403 | B2 * | 3/2003 | Beckhart et al. | 700/254 |
| 6,606,914 | B2 * | 8/2003 | Kume | 73/849 |
| 6,889,818 | B2 * | 5/2005 | Stacey | 198/750.11 |
| 7,150,179 | B2 * | 12/2006 | Takafuji et al. | 73/12.09 |
| 7,418,970 | B2 * | 9/2008 | Sugimoto et al. | 134/105 |
| 8,286,528 | B2 * | 10/2012 | Fujioka et al. | 74/490.05 |
| 2004/0186626 | A1 | 9/2004 | Tsukamoto et al. | |
| 2005/0207875 | A1 * | 9/2005 | Kim | 414/217 |

FOREIGN PATENT DOCUMENTS

| | | | |
|---|---|---|---|
| JP | 1-210293 | A | 8/1989 |
| JP | 8-25276 | A | 1/1996 |
| JP | 9-306970 | A | 11/1997 |
| JP | 2001-228036 | A | 8/2001 |
| JP | 2003-60004 | | 2/2003 |
| JP | 2007-198892 | A | 8/2007 |
| KR | 10-2004-0032934 | A | 4/2004 |
| KR | 10-2004-0093302 | A | 11/2004 |

* cited by examiner

*Primary Examiner* — Saul Rodriguez
*Assistant Examiner* — Glenn Myers
(74) *Attorney, Agent, or Firm* — Oblon, Spivak, McClelland, Maier & Neustadt, L.L.P.

(57) ABSTRACT

A transfer device for transferring a transfer target object includes a support member, which is movable forward and backward, for supporting the transfer target object, and a sensor for detecting that a tip of the support member comes into contact with an obstacle when the support member moves forward. The sensor includes a first conductive ring having flexibility, which is provided at the tip of the support member in a grounded state, a second conductive ring provided inside the first conductive ring and separated from the first conductive ring, and a detector which detects that the first conductive ring and the second conductive ring are short-circuited when the first conductive ring comes into contact with the second conductive ring by being deformed due to a contact with the obstacle.

7 Claims, 8 Drawing Sheets

TRANSFER DEVICE, PROCESSING SYSTEM, CONTROL METHOD OF TRANSFER DEVICE, AND COMPUTER-READABLE STORAGE MEDIUM

CROSS-REFERENCE TO RELATED APPLICATIONS

This application claims priority to Japanese Patent Application No. 2010-208228 filed on Sep. 16, 2010, the entire contents of which are incorporated herein by reference.

FIELD OF THE INVENTION

The present invention relates to a transfer device, a processing system, a control method of the transfer device, and a computer-readable storage medium.

BACKGROUND OF THE INVENTION

In a case where a glass substrate is processed at a high temperature in, e.g., a CVD apparatus, the glass substrate may be broken due to heat or the like. In loading and unloading the glass substrate, the glass substrate is lifted up in a chamber while edges thereof are being supported and a pick of a transfer device is extended under the bottom of the glass substrate that has been lifted up. If the glass substrate is broken, only one part of the glass substrate is lifted up, so that a broken part of the glass substrate interferes with a moving path of the pick. Accordingly, the tip of the pick collides with the glass substrate, and the broken glass substrate is broken into pieces and the pieces are scattered in the chamber. It takes a lot of time to remove the broken glass substrate or pieces from the chamber and restore the apparatus. Further, an operation of a fabrication line is stopped until the apparatus is restored.

Accordingly, for example, Japanese Patent Application Publication No. 2003-60004 discloses a sensor for detecting a contact with an obstacle that is attached to a tip of a pick (robot hand).

In Japanese Patent Application Publication No. 2003-60004, sealed hollow members filled with a fluid, which are freely expanded and contracted, are attached to tips of picks. When the hollow members come into contact with an obstacle, the hollow members are deformed, and the pressure of the fluid sealed in the hollow members increases. The pressure increase is detected by a pressure sensor, thereby detecting that the tips of the picks come into contact with the obstacle.

Japanese Patent Application Publication No. 2003-60004 discloses a method in which an increase in the pressure of the fluid sealed in the hollow members is detected by a pressure sensor. Accordingly, in a case where a transfer device transfers a glass substrate in a depressurized environment, the hollow members are hardly deformed and it is difficult to detect the contact with an obstacle.

SUMMARY OF THE INVENTION

In view of the above, the present invention provides a transfer device capable of detecting a contact with an obstacle even in a depressurized environment, a processing system including the transfer device, a control method of the transfer device capable of preventing an obstacle from being broken, and a computer-readable storage medium storing a program for executing the control method in the transfer device.

In accordance with a first aspect of the present invention, there is provided a transfer device for transferring a transfer target object including: a support member, which is movable forward and backward, for supporting the transfer target object; and a sensor for detecting that a tip of the support member comes into contact with an obstacle when the support member moves forward. The sensor includes: a first conductive ring having flexibility, which is provided at the tip of the support member in a grounded state; a second conductive ring provided inside the first conductive ring and separated from the first conductive ring; and a detector for detecting that the first conductive ring and the second conductive ring are short-circuited when the first conductive ring comes into contact with the second conductive ring by being deformed due to a contact with the obstacle.

In accordance with a second aspect of the present invention, there is provided a processing system including: a common transfer chamber; a processing chamber connected to the common transfer chamber to perform a process on a processing target object; and the transfer device described in the first aspect of the present invention, the transfer device being placed in the common transfer chamber to transfer the processing target object.

In accordance with a third aspect of the present invention, there is provided a control method of a transfer device for transferring a transfer target object, the transfer device including a support member, which is movable forward and backward, for supporting the transfer target object, and a sensor for detecting that a tip of the support member comes into contact with an obstacle when the support member moves forward. The method includes: moving the support member forward at a first speed toward a specific position; moving the support member forward at a second speed lower than the first speed toward the specific position in a checking section for checking presence or absence of the obstacle, the checking section being provided before the specific position; and moving the support member forward at a third speed higher than the second speed toward the specific position after passing through the checking section.

In accordance with a fourth aspect of the present invention, there is provided a computer-readable storage medium storing a control program for controlling a transfer device for transferring a transfer target object. The control program, when executed by a computer, controls the transfer device to perform the control method described above.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described with reference to the accompanying drawings which form a part hereof. Further, like reference numerals will be given to like part throughout the drawings.

(First Embodiment)

Figure 1:
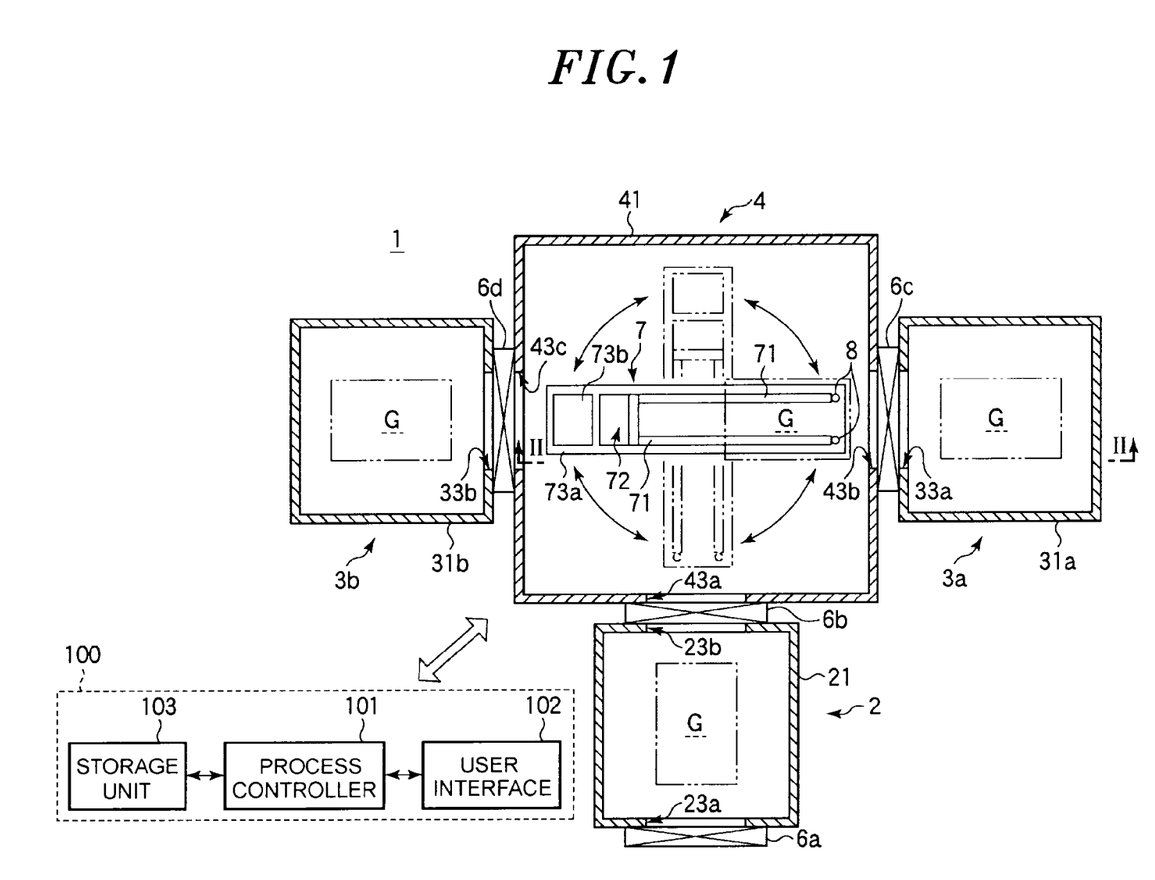
FIG. 1 is a horizontal cross-sectional view showing an example of a processing system including a transfer device in accordance with a first embodiment of the present invention.
Figure 2A:
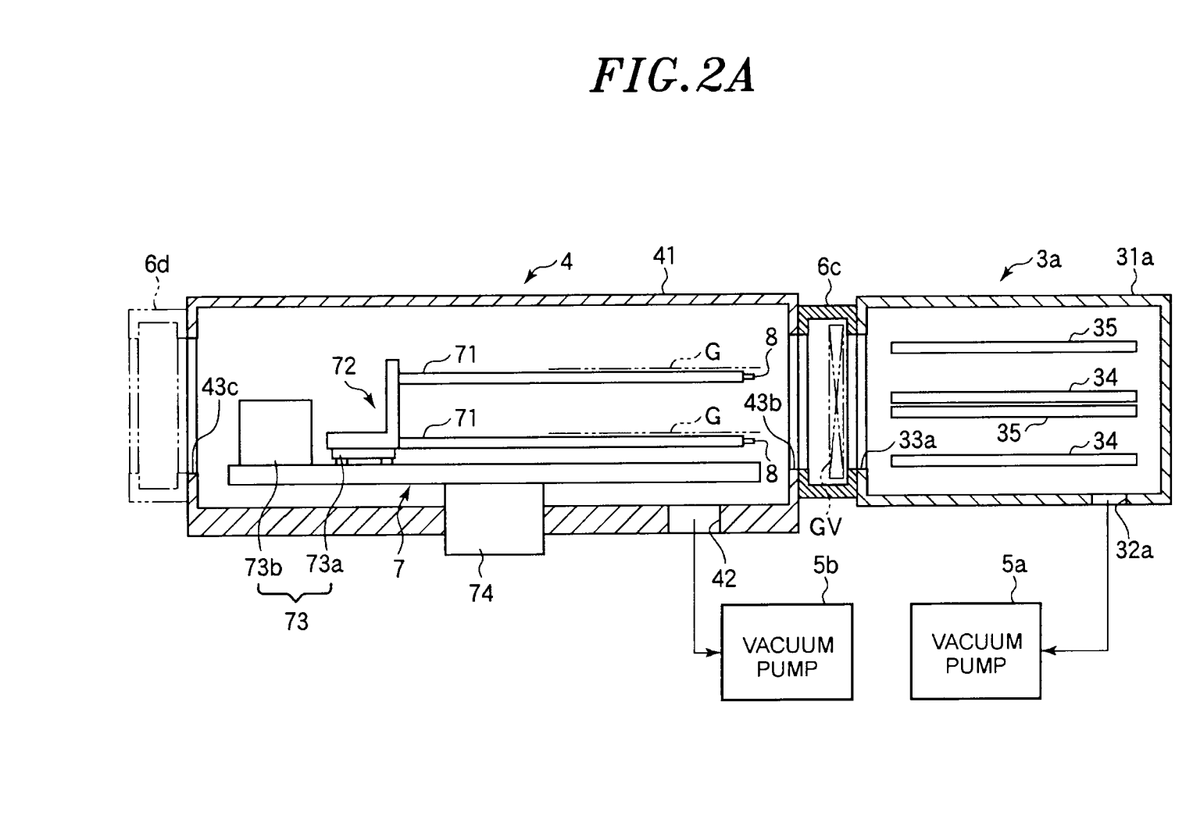
FIGS. 2A and 2B are cross-sectional views taken along line II-II shown in FIG. 1 (showing a state where the transfer device is retreated)
Figure 2B:
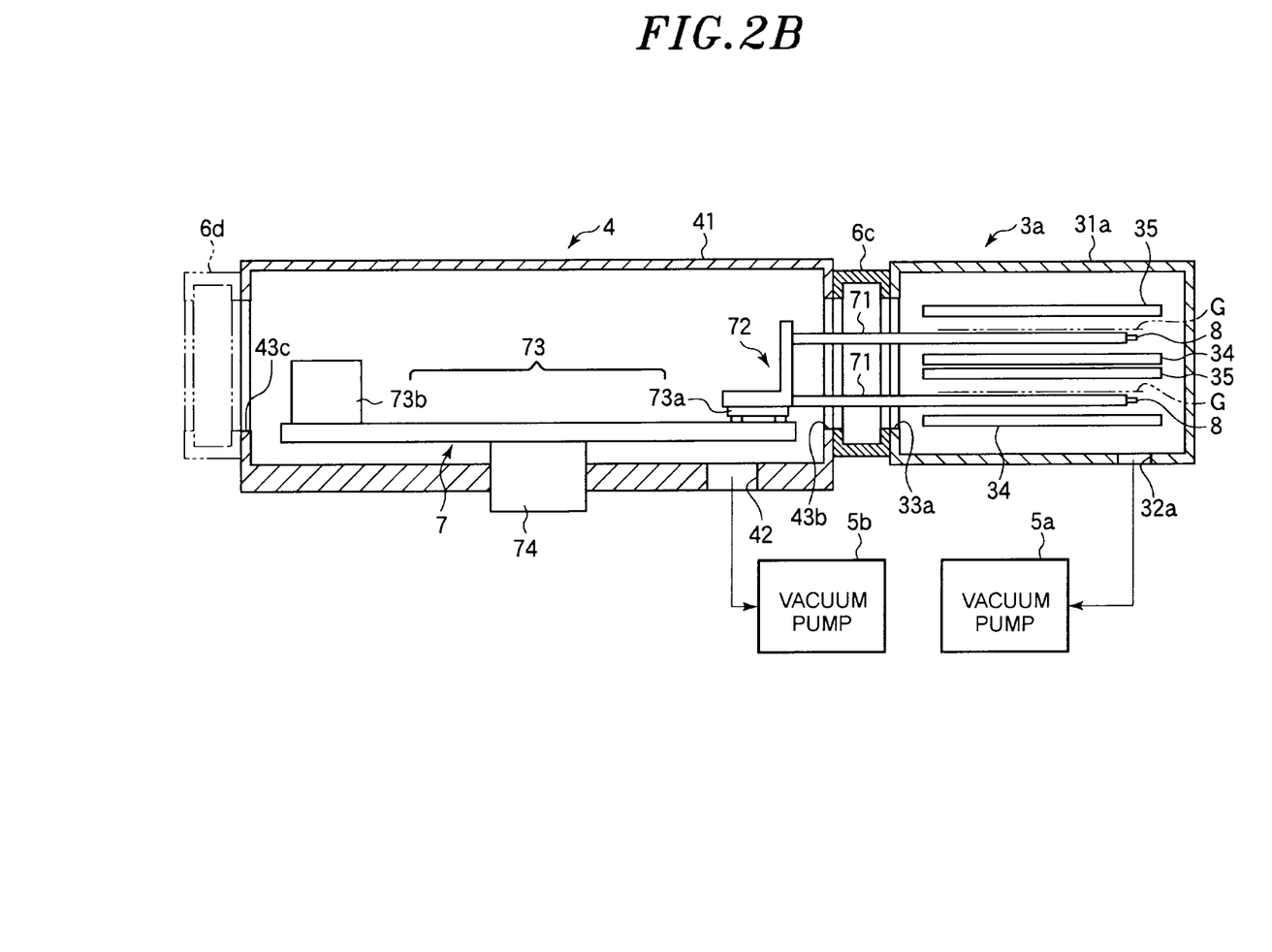

The processing system shown in FIGS. 1, 2A and 2B is a processing system in which a glass substrate for the manufacture of a solar cell module or flat panel display (FPD) is used as a transfer target object and a film formation is performed on the glass substrate.

As shown in FIG. 1, the processing system 1 includes a load-lock chamber 2, processing chambers 3a and 3b, and a common transfer chamber 4. A pressure conversion between an atmospheric environment and a depressurized environment is performed in the load-lock chamber 2. In the processing chambers 3a and 3b, a thermal treatment such as a heat treatment and a film formation is performed on the transfer target object G, e.g., the glass substrate.

In this embodiment, the load-lock chamber 2, the processing chambers 3a and 3b and the common transfer chamber 4 are vacuum apparatuses, and include main bodies 21, 31a, 31b, and 41, respectively. Each of the main bodies 21, 31a, 31b and 41 is airtightly sealed so that the transfer target object G can be maintained in a depressurized state, and is connected to a gas exhaust unit such as a vacuum pump through a gas exhaust port to create a depressurized state therein. FIGS. 2A and 2B illustrate a gas exhaust port 32a provided in the processing chamber 3a and a vacuum pump 5a connected thereto; and a gas exhaust port 42 provided in the common transfer chamber 4 and a vacuum pump 5b connected thereto. Further, openings 23a, 23b, 33a, 33b, 43a, 43b, and 43c are provided in the main bodies 21, 31a, 31b, and 41. The transfer target object G is loaded and unloaded through the openings 23a, 23b, 33a, 33b, 43a, 43b, and 43c.

The main body 21 of the load-lock chamber 2 communicates with an outside of the processing system 1, i.e., an atmospheric environment, through the opening 23a and a gate valve box 6a. The gate valve box 6a includes a gate valve GV for opening and closing the opening 23a. An example of the gate valve GV is illustrated in FIG. 2A. Further, the main body 21 communicates with the main body 41 through the opening 23b, a gate valve box 6b and the opening 43a. The gate valve box 6b includes a gate valve GV for opening and closing the opening 23b.

The main body 31a of the processing chamber 3a communicates with the main body 41 through the opening 33a, a gate valve box 6c including a gate valve GV for opening and closing the opening 33a, and the opening 43b. Similarly, the main body 31b of the processing chamber 3b communicates with the main body 41 through the opening 33b, a gate valve box 6d including a gate valve GV for opening and closing the opening 33b, and the opening 43c.

The main body 41 of the common transfer chamber 4 has a rectangular shape in its plan view. The openings 43a, 43b and 43c are provided at three sides among the four sides of the rectangular main body 41. In the common transfer chamber 4, there is installed a transfer device 7 in accordance with the first embodiment of the present invention. The transfer device 7 transfers the transfer target object G from the load-lock chamber 2 to the processing chamber 3a (or 3b), from the processing chamber 3a (or 3b) to the processing chamber 3b (or 3a), and from the processing chamber 3a (or 3b) to the load-lock chamber 2. Accordingly, the transfer device 7 is configured to perform an elevation operation for vertically moving up and down the transfer target object G, a rotation operation for rotating the transfer target object G, and an extension and a retreat operation for transferring the transfer target object G into and from the load-lock chamber 2 and the processing chambers 3a and 3b.

Each part of the processing system 1 and the transfer device 7 is controlled by a control unit 100. The control unit 100 includes a process controller 101 having a microprocessor (computer). The process controller 101 is connected to a user interface 102 for an operator to manage the processing system 1. The user interface 102 includes a keyboard through which the operator inputs commands, a display for visualizing an operational status of the processing system 1 and the like.

Further, the process controller 101 is connected to a storage unit 103. The storage unit 103 stores therein control programs for implementing various processes performed in the processing system 1 under the control of the process controller 101, and recipes for executing a process in each part of the processing system 1 in accordance with processing conditions. The recipes are stored in, e.g., a storage medium of the storage unit 103. The storage medium may be a hard disk, a semiconductor memory, or a portable storage medium such as a CD-ROM, a DVD and a flash memory or the like. Further, the recipes may be appropriately transmitted from another device via, e.g., a dedicated transmission line. When a command is received from the user interface 102, a necessary recipe is retrieved from the storage unit 103 and a process corresponding to the retrieved recipe is executed by the process controller 101, so that a desired process and control are performed in the processing system 1 and on the transfer device 7 under the control of the process controller 101.

FIG. 2A illustrates a state where the transfer device 7 is retreated into the common transfer chamber 4, and FIG. 2B illustrates a state where the transfer device 7 is extended into the processing chamber 3a.

As illustrated in FIGS. 2A and 2B, the transfer device 7 includes a pick unit 72 having picks 71 as support members each for supporting the transfer target object G, a slide unit 73 for sliding the pick unit 72, and a drive unit 74 for driving the slide unit 73.

A slide base 73a is attached to the slide unit 73, and the pick unit 72 is attached to the slide base 73a. The slide base 73a is slid back and forth in a longitudinal direction of the slide unit 73 by the slide base driving unit 73b. Accordingly, the pick unit 72 moves forward and backward to advance into and retreat from the load-lock chamber 2 and the processing chambers 3a and 3b. For example, as shown in FIG. 2B, when the slide base 73a is slid, the pick unit 72 attached to the slide base 73a is advanced into the processing chamber 3a through, e.g., the openings 43b and 33a.

Further, the slide unit 73 can be elevated and rotated by the drive unit 74. Accordingly, for example, the slide unit 73 is elevated and rotated in the common transfer chamber 4.

The processing system 1 of this embodiment is configured such that a plurality of transfer target objects G is simultaneously horizontally mounted in a vertical direction, so that the plurality of transfer target objects G is processed at the same time. For example, multiple stages each having a pair of a lower electrode 34 and an upper electrode 35 are vertically arranged in the processing chamber 3a. In this embodiment, two vertical stages each having a pair of the lower electrode 34 and upper electrode 35 are arranged such that two transfer target objects G are simultaneously processed by a plasma generated between the upper and lower electrodes 34 and 35. Accordingly, the transfer device 7 is configured to transfer a plurality of transfer target objects G at a time. In this embodiment, the pick unit 72 includes the picks 71 arranged in two vertical stages to transfer two transfer target objects G at a time. A sensor 8 is attached to a tip of each of the two picks 71 to detect whether there is an obstacle in a direction of the forward movement of the pick 71.

Figure 3A:
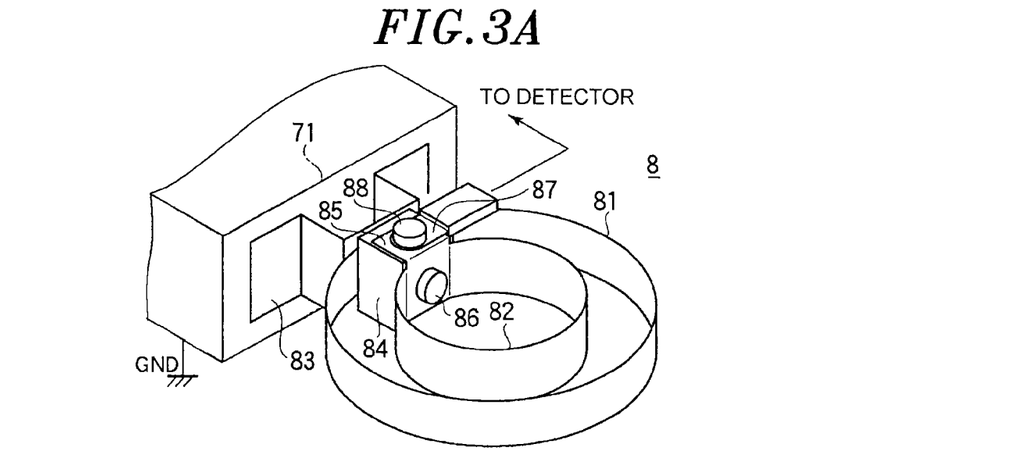
FIG. 3A is a perspective view showing an example of a sensor.

FIG. 3A is a perspective view showing an example of the sensor 8. Further, FIG. 3B is an exploded view of the sensor 8.

Figure 3B:
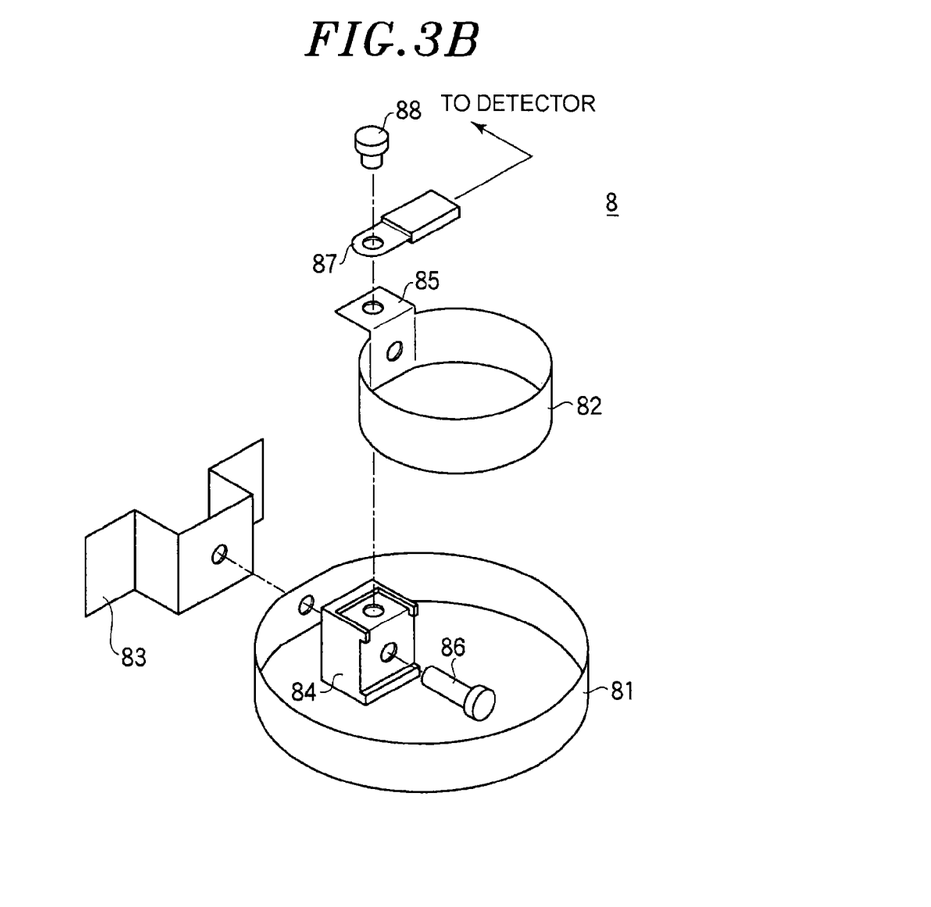
FIG. 3B is an exploded view of the sensor.

As illustrated in FIGS. 3A and 3B, the sensor 8 includes a first conductive ring 81 provided at the tip of the pick 71 and a second conductive ring 82 provided inside the first conductive ring 81. The first conductive ring 81 and the second conductive ring 82 are made of, e.g., flexible spring steel such as stainless steel and phosphor bronze.

An exemplary method for attaching the first conductive ring 81 and the second conductive ring 82 to the tip of the pick 71 will be described below.

First, a base 83 having a protrusion is fixed to the tip of the pick 71 by means of, e.g., screws. Then, a part of a side surface of the first conductive ring 81 is interposed between the protrusion of the base 83 and an insulating member 84. The insulating member 84 is a member for maintaining a state where the first conductive ring 81 is insulated and separated from the second conductive ring 82. An electrical contact terminal 85 is provided at an upper portion of the second conductive ring 82 to extend outwardly from the second conductive ring 82. The electrical contact terminal 85 is placed on an upper surface of the insulating member 84 while a side surface of the second conductive ring 82 is in contact with the insulating member 84. Then, the second conductive ring 82, the insulating member 84 and the first conductive ring 81 are fixed to the base 83 by means of an insulating screw 86.

In this case, the pick 71 is grounded. Therefore, if the base 83 is formed of a conductive material, there is advantageous in that the first conductive ring 81 can be grounded only by attaching the first conductive ring 81 to the base 83. Then, one end of the detection terminal 87 is made in contact with the electrical contact terminal 85. The other end of the detection terminal 87 is connected to a detector for detecting whether the first conductive ring 81 and the second conductive ring 82 have been short-circuited. Then, the detection terminal 87 and the electrical contact terminal 85 are fixed to the upper surface of the insulating member 84 by means of a conductive screw 88.

In this way, the first conductive ring 81 and the second conductive ring 82 can be attached to the tip of the pick 71.

Further, although the electrical contact terminal 85 is formed to extend outwardly from the upper portion of the second conductive ring 82 in this embodiment, the electrical contact terminal 85 may be formed to extend outwardly from a lower portion of the second conductive ring 82, and there is no need to extend outwardly if it can be connected to the detection terminal 87.

Next, an example of the detection will be described in detail.

Figure 4A:
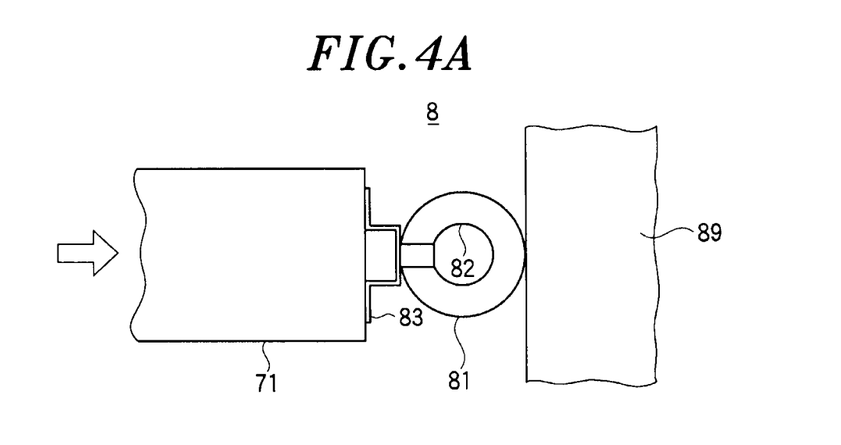
FIGS. 4A to 4C are plan views showing different states while the sensor comes into contact with an obstacle.
Figure 4B:
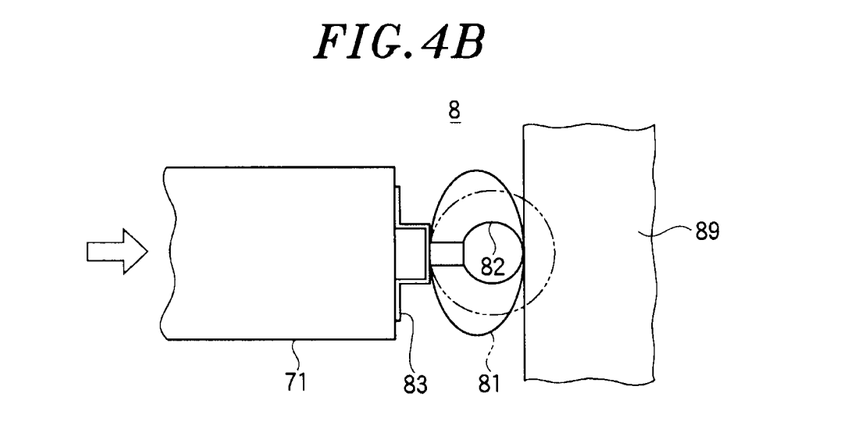
Figure 4C:
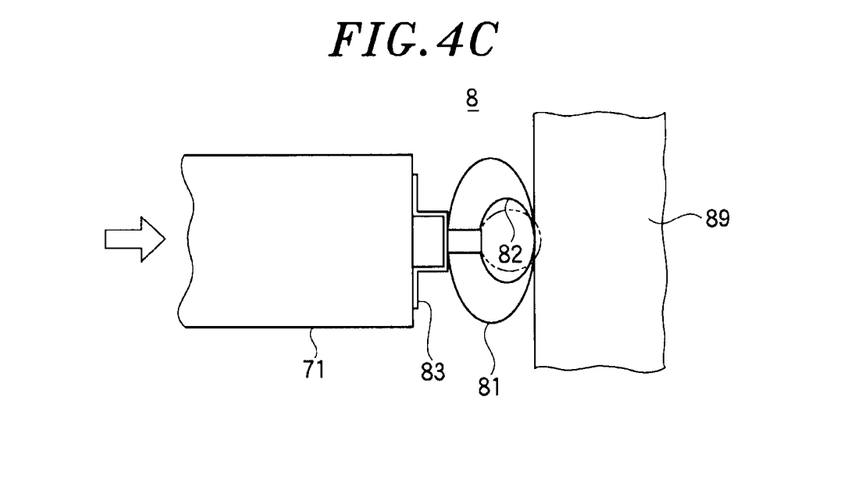

FIGS. 4A to 4C are plan views showing different states while the sensor 8 comes into contact with an obstacle.

First, as shown in FIG. 4A, if there is an obstacle 89 in a direction of the forward movement of the pick 71, the first conductive ring 81 comes into contact with the obstacle 89 as the pick 71 moves forward. The first conductive ring 81 is flexible. Therefore, the first conductive ring 81 is deformed by the continuous forward movement of the pick 71 after the first conductive ring 81 comes into contact with the obstacle 89. Then, as shown in FIG. 4B, the first conductive ring 81 comes into contact with the second conductive ring 82 such that the grounded first conductive ring 81 and second conductive ring 82 are short-circuited. This short-circuiting is detected by the detector, thereby detecting that the tip of the pick 71 has made contact with the obstacle.

Further, in this embodiment, the second conductive ring 82 is also formed of the flexible conductive material. Therefore, even though the pick 71 continues to move forward during the time period from the detection of the short-circuiting until the movement of the pick 71 is stopped, the obstacle 89 is prevented from being broken since the second conductive ring 82 is deformed as shown in FIG. 4C.

Further, for example, the first conductive ring 81, which is formed of stainless steel, has a diameter of 55 mm and a plate thickness of 0.05 mm. Also, for example, the second conductive ring 82, which is formed of stainless steel, has a diameter of 36 mm and a plate thickness of 0.05 MM.

As described above, since each of the first conductive ring 81 and the second conductive ring 82 has a thin plate thickness of about 0.05 mm, they can be restored. Accordingly, even though the first conductive ring 81 is deformed as coming into contact with the obstacle or the second conductive ring 82 is deformed as coming into contact with the first conductive ring 81, each ring can be restored and thus reused.

Further, the first conductive ring 81 is separated from the second conductive ring 82 by about 10 mm in the above example. When the first conductive ring 81 and the second conductive ring 82 are separated from each other as described above, it becomes possible to prevent the first conductive ring 81 and the second conductive ring 82 from coming into contact with each other even when the first conductive ring 81 and the second conductive ring 82 are vibrated while the pick 71 moves back and forth or rotates.

Figure 5A:
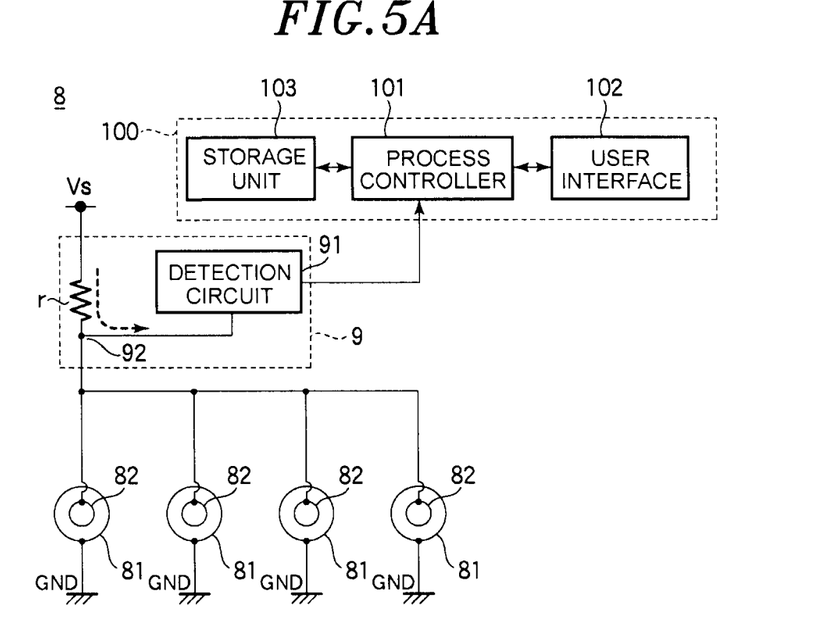
FIGS. 5A and 5B are circuit diagrams showing an exemplary equivalent circuit of the sensor.
Figure 5B:
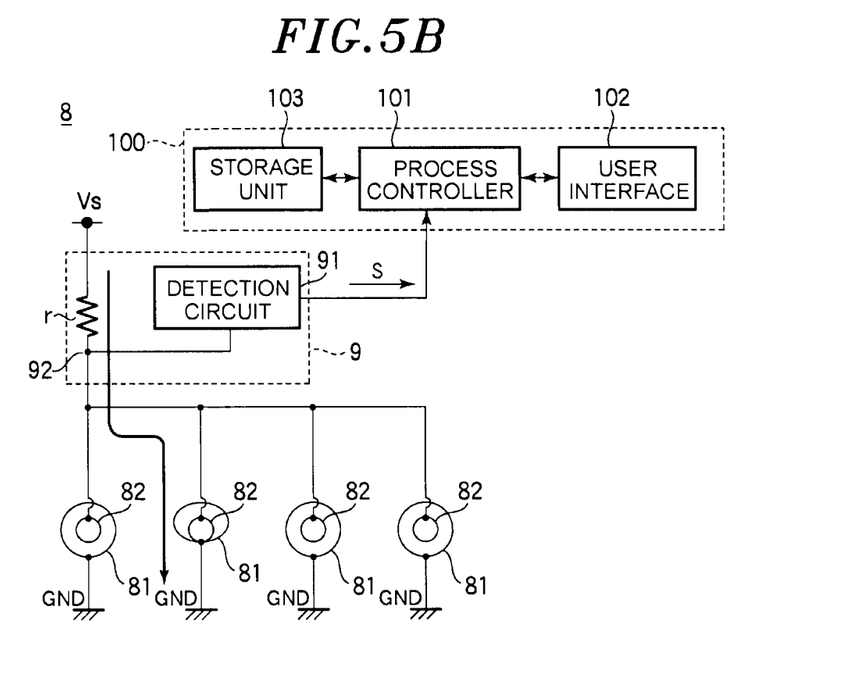

FIGS. 5A and 5B are circuit diagrams showing an exemplary equivalent circuit of the sensor 8.

As illustrated in FIG. 5A, there are provided four picks 71 in this embodiment. Accordingly, an equivalent circuit of this embodiment has four first conductive rings 81 and four second conductive rings 82. Each of the four first conductive rings 81 is grounded. Further, each of the four second conductive rings 82 is connected to one end of a detector 9. The detector 9 includes, e.g., a resistor r and a detection circuit 91. One end of the resistor r is connected to a power source Vs, and the other end of the resistor r is connected to each of the four second conductive rings 82. An input of the detection circuit 91 is connected to an interconnection node 92 between the resistor r and the four second conductive rings 82, and an output of the detection circuit 91 is connected to the process controller 101.

A detection current I flows in the detection circuit 91, supplied from the power source Vs via the resistor r. As shown in FIG. 5A, the detection current I is constant in a state where the first conductive ring 81 and the second conductive ring 82 are not short-circuited. Accordingly, the potential of the interconnection node 92 has a constant value.

Further, the power source Vs has the potential of, e.g., about 24 V and the current I of, e.g., about 15 mA.

If any one of the first conductive rings 81 comes into contact with the second conductive ring 82, as shown in FIG. 5B, the interconnection node 92 is short-circuited to a ground GND via the first conductive ring 81 and the second conductive ring 82 that are in contact with each other. Accordingly, the detection current I flows from the power source Vs toward the ground GND, and the potential of the interconnection node 92 is changed (reduced in this embodiment). The decrease in the potential is detected by the detection circuit 91, thereby detecting that the tip of the pick 71 has come into contact with the obstacle. Anything capable of detecting the decrease in the potential of the interconnection node 92, e.g., a voltmeter, an ammeter, a comparator for comparing a potential difference between both ends of the resistor r or the like may be used as the detection circuit 91.

The detection circuit 91 transmits a signal S indicating "the contact with an obstacle" to the process controller 101 if it detects the decrease in the potential of the interconnection node 92. If the process controller 101 receives the signal S indicating "the contact with an obstacle," the process controller 101 outputs a command for the transfer device 7 to stop the forward (advance) movement of the picks 71. Upon receipt of the command, the transfer device 7 stops the forward movement of the picks 71. Then, the transfer device 7 performs the backward (retreat) movement of the picks 71. Then, the processing system 1 is stopped such that a removal operation of the obstacle can be performed. Alternatively, if there is a plurality of processing chambers, the use of the processing chamber including the obstacle is temporarily stopped.

Further, each of the first conductive ring 81 and the second conductive ring 82 is of a mechanical contact point. Accordingly, when the first conductive ring 81 is in contact with the second conductive ring 82, chattering may occur. When chattering occurs, the potential of the interconnection node 92 bounces up and down and is gradually reduced to a ground potential. During chattering, the detection circuit 91 repeatedly transmits the signal S.

In order to prevent such situation, for example, if the decrease in the potential is continuously measured several times within a control cycle (cycle of a control clock), it may be determined that the tip of the pick 71 is "in contact with an obstacle." For example, the control cycle is 20 ms. If the decrease in the potential is continuously measured two or more times within a control cycle of, e.g., 20 ms, the detection circuit 91 transmits the signal S to the process controller 101. Alternatively, if the process controller 101 continuously receives the signal S two or more times within a control cycle of 20 ms, the process controller 101 may determine that the tip of the pick 71 is "in contact with an obstacle."

Further, in case of using this determination method, a case where the first conductive ring 81 and the second conductive ring 82 come into instantaneous contact with each other due to vibration in forward/backward movement or a centrifugal force in rotation can be prevented from being determined as "the contact with an obstacle". Accordingly, there are advantages of increasing accuracy in the determination on "the contact with an obstacle" and preventing a detection error.

As described above, in the transfer device in accordance with the first embodiment of the present invention, the sensor 8 has the first conductive ring 81 having flexibility which is provided at the tip of the pick in a grounded state and the second conductive ring 82 provided inside the first conductive ring 81. Further, the sensor 8 includes the detector 9 which detects that the first conductive ring 81 and the second conductive ring 82 are short-circuited when the grounded first conductive ring 81 comes into contact with the second conductive ring 82 by being deformed due to the contact with the obstacle 89.

The transfer device of the first embodiment makes it possible to detect that the tip of the pick 71 comes into contact with the obstacle even in the depressurized environment.

(Second Embodiment)

A control method of a transfer device capable of preventing the obstacle from being broken in accordance with a second embodiment of the present invention will be described.

Preferably, the control method of a transfer device in accordance with the second embodiment may be applied to the transfer device of the first embodiment.

However, the control method of a transfer device in accordance with the second embodiment may be applied to any transfer device including a forward/backward movable support member (pick) for supporting a transfer target object and a sensor detecting that a tip of the support member comes into contact with an obstacle when the support member moves forward, in addition to the transfer device of the first embodiment.

In the control method of a transfer device in accordance with the second embodiment, a speed at which the picks 71 move forward is changed, for example, depending on whether there are transfer target objects G in the processing chamber or not. That is, the control of sliding the pick unit 72 by the slide unit 73 is changed depending on whether there are transfer target objects G in the processing chamber or not.

Figure 6:
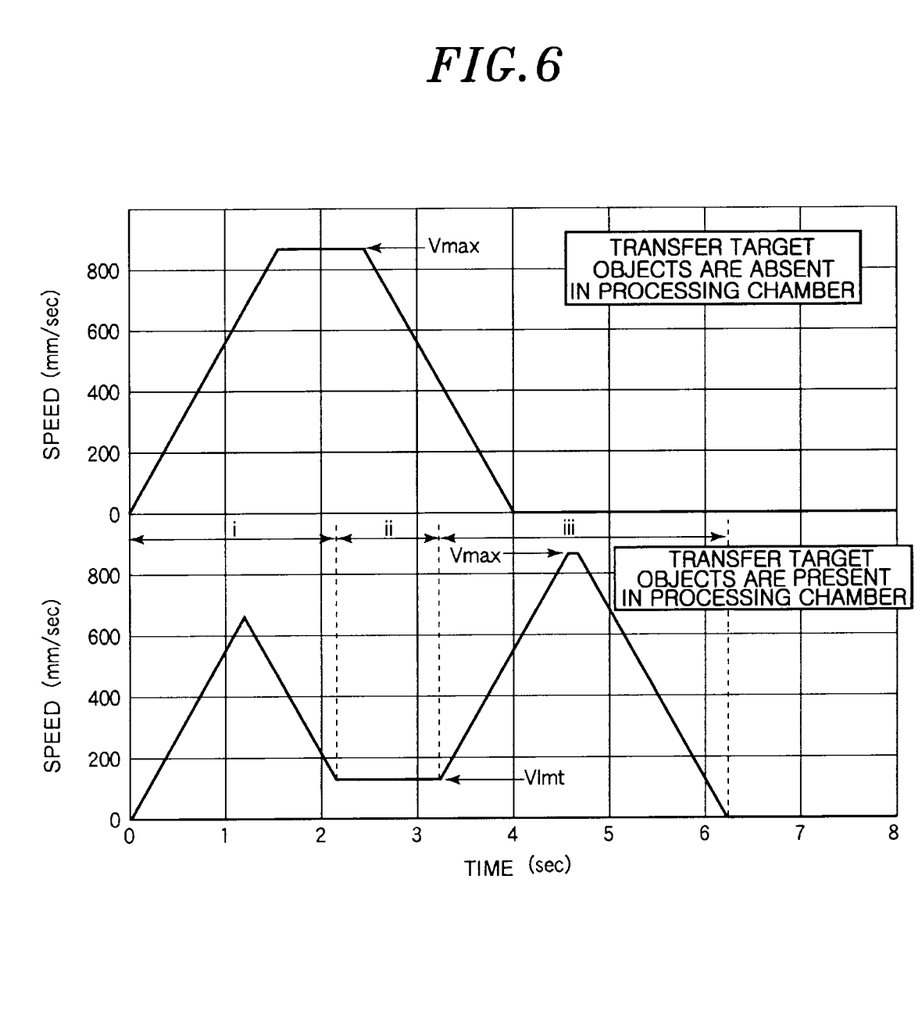
FIG. 6 is a timing diagram showing an example of a control method of a transfer device in accordance with a second embodiment of the present invention.

FIG. 6 is a timing diagram showing an example of the control method of a transfer device in accordance with the second embodiment of the present invention. In FIG. 6, a vertical axis represents a sliding speed of the picks 71, and a horizontal axis represents time.

(Case in which the Transfer Target Objects are Absent in the Processing Chamber)

For example, when the transfer target objects G are absent in the processing chamber, it can be determined that "there is no obstacle" in the direction of the forward movement of the picks 71. Accordingly, as shown in an upper waveform of FIG. 6, the picks 71 can be moved forward at a maximum speed Vmax in all sections from the common transfer chamber to a specific position in the processing chamber, e.g., reception positions of the transfer target objects G in the processing chamber.

(Case in which the Transfer Target Objects are Present in the Processing Chamber)

For example, when the transfer target objects G are present in the processing chamber, it can be determined that "there may be an obstacle" in the direction of the forward movement of the picks 71. Accordingly, as shown in a lower waveform of FIG. 6, the picks 71 are not moved forward at a maximum speed Vmax in all sections from the common transfer chamber to the reception positions of the transfer target objects G in the processing chamber. In this case, in a section in which it is determined that "there may be an obstacle" (hereinafter, referred to as a checking section ii), the picks 71 are moved forward while the speed of the picks 71 is set to, at most, a speed limit Vlmt that is less than the maximum speed.

Specifically, as illustrated in FIG. 6, in a section i from an initial position, e.g., the common transfer chamber to a start point of the checking section ii, the picks 71 are moved forward without limiting the speed of the picks 71. Since the speed is not limited in the section i, the picks 71 may be moved at the maximum speed Vmax. However, if the section i is short, as in the example of FIG. 6, the speed may be reduced before reaching the maximum speed Vmax.

The speed of the picks 71 is reduced to the speed limit Vlmt until the picks 71 enter the checking section ii. In the checking section ii, the picks 71 are moved forward at the speed limit Vlmt by limiting the speed. If the tips of the picks 71 come into contact with the obstacle, the speed of the picks 71 is reduced from the speed limit Vlmt to zero, and the picks 71 stop moving. In this case, since the speed of the picks 71 is limited, the time until the picks 71 are stopped may be shorter than that taken when the speed of the picks 71 is not limited.

After the picks 71 pass through the checking section ii, the speed limit is released and the picks 71 are moved forward to the reception positions of the transfer target objects G in the processing chamber (section iii). Since the speed is not limited in the section iii, the picks 71 may be moved at the maximum speed Vmax as in the example of FIG. 6. However, if the section iii is short, the speed may be reduced before reaching the maximum speed Vmax.

Figure 7:
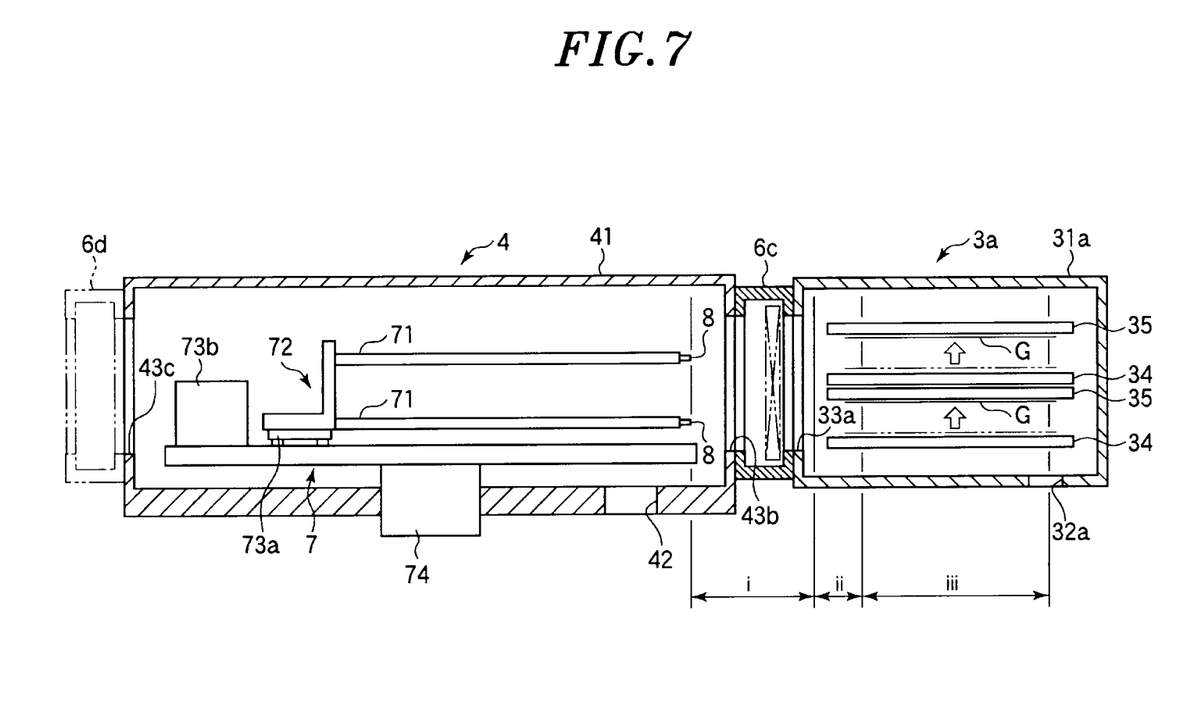
FIG. 7 illustrates an example of a section i, a checking section ii, and a section iii.

FIG. 7 illustrates an example of the section i, the checking section ii, and the section iii.

As illustrated in FIG. 7, the transfer target objects G are present at the reception positions of the processing chamber 3a, and the transfer target objects G are lifted up at the reception positions, awaiting the movement of the picks 71.

The section i is a section ranging from the tips of the picks 71, in a state where the picks 71 are being retreated, to the start point of the checking section ii.

The checking section ii is a section around ends of the transfer target objects G arranged at the reception positions, the ends facing the common transfer chamber 4. The reason why the checking section ii is defined as the above is that a broken transfer target object G is regarded as the obstacle.

The section iii is a section ranging from an end point of the checking section ii to the reception positions.

The length of each of the section i, the checking section ii and the section iii may be changed appropriately depending on the size of the transfer target objects G or the size of the common transfer chamber 4 or the processing chamber 3a.

However, the checking section ii may be set to coincide with a place that is expected to be determined as "the obstacle may be present", for example, in a range from about 140 to 160 mm, wherein the start point of the checking section ii is 90 to 100 mm away, toward the common transfer chamber 4, from the common transfer chamber 4 side ends of the transfer target objects G arranged at the reception positions and the end point of the checking section ii is 50 to 60 mm away, toward the direction opposite to the common transfer chamber 4, from the common transfer chamber 4 side ends of the transfer target objects G. One example of the obstacle is a broken transfer target object G.

As described above, in the second embodiment, the speed of the picks 71 is reduced to, at most, the speed limit Vlmt that is less than the maximum speed in the checking section ii where it is expected to be determined that "the obstacle may be present." Accordingly, even though the tips of the picks 71 come into contact with the obstacle, because the speed of the picks 71 is reduced to the speed limit Vlmt, it is possible to prevent the obstacle from being further broken.

Further, even when the sensor 8 determines "the tip of the pick is in contact with an obstacle," the picks 71 can be stopped quickly because the speed of the picks 71 is reduced to the speed limit Vlmt.

Further, the control of sliding the pick unit 72 by the slide unit 73 is changed depending on whether the transfer target objects G are present in the processing chamber or not, and the speed of the picks 71 is not limited when the transfer target objects G are absent in the processing chamber. As described above, since the speed of the picks 71 is not limited when the transfer target objects G are absent in the processing chamber, it is possible to suppress an increase in loading time when the transfer device 7 loads the transfer target objects G and minimize the processing time in the processing system 1.

While the invention has been shown and described with respect to the embodiments, the present invention is not limited thereto and various changes and modification may be made.

For example, although a case where the picks 71 are advanced into the processing chamber 3a from the common transfer chamber 4 has been described in the second embodiment, the second embodiment may be applied to a case where the picks 71 are advanced into the load-lock chamber 2 from the common transfer chamber 4.

Further, FIG. 1 and the like show that the transfer target objects G are vertically overlapped with the sensors 8. However, when the transfer target objects G are supported by the picks 71, the transfer target objects G may or may not be vertically overlapped with the sensors 8 since the sensors 8 are provided to detect the case where the tips of the picks 71 come into contact with the broken transfer target object G.

In accordance with above-described embodiments of the present invention, it is possible to provide a transfer device capable of detecting a contact with an obstacle even in a depressurized environment, a processing system including the transfer device, a control method of the transfer device capable of preventing an obstacle from being broken, and a computer-readable storage medium storing a program for executing the control method in the transfer device.

While the invention has been shown and described with respect to the embodiments, it will be understood by those skilled in the art that various changes and modification may be made without departing from the scope of the invention as defined in the following claims.

What is claimed is:

1. A transfer device for transferring a transfer target object comprising:
    a support member, which is movable forward and backward, for supporting the transfer target object;
    a sensor for detecting that a tip of the support member comes into contact with an obstacle when the support member moves forward,
    wherein the sensor includes a first conductive ring having flexibility, which is provided at the tip of the support member in a grounded state; a second conductive ring provided inside the first conductive ring and separated from the first conductive ring; and a detector for detecting that the first conductive ring and the second conductive ring are short-circuited when the first conductive ring comes into contact with the second conductive ring by being deformed due to contact with the obstacle;
    a base having a protrusion and fixed to the tip of the support member;
    an insulating member for maintaining a state where the first conductive ring is insulated and separated from the second conductive ring; and
    a detection terminal having one end connected to the detector,
    wherein an electrical contact terminal is provided at an upper portion of the second conductive ring to extend outwardly,
    wherein the first conductive ring and the second conductive ring are attached to the tip of the support member in a state where a part of a side surface of the first conductive ring is interposed between the protrusion of the base and the insulating member, and the electrical contact terminal is placed on an upper surface of the insulating member while a side surface of the second conductive ring is in contact with the insulating member, and
    wherein the other end of the detection terminal is in contact with the electrical contact terminal.

2. The transfer device of claim 1, wherein the second conductive ring has flexibility.

3. The transfer device of claim 1, wherein the support member is grounded and the base is conductive.

4. The transfer device of claim 1, wherein the detector detects that the first conductive ring and the second conductive ring are short-circuited by detecting variation in a potential of said one end of the detection terminal.

5. A processing system comprising:
   a common transfer chamber;
   a processing chamber connected to the common transfer chamber to perform a process on a processing target object; and
   a transfer device as recited in claim 1, the transfer device being placed in the common transfer chamber to transfer the processing target object.

6. The processing system of claim 5, wherein the processing chamber and the common transfer chamber are airtightly sealed and are capable of maintaining a depressurized state therein.

7. The processing system of claim 5, wherein the processing chamber performs a thermal treatment on the processing target object.

* * * * *